United States Patent
Ichimaru

(10) Patent No.: US 6,411,239 B1
(45) Date of Patent: Jun. 25, 2002

(54) DIGITAL-ANALOG AND ANALOG-DIGITAL CONVERTER

(75) Inventor: Kouzou Ichimaru, Kunisaki-machi (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/562,481

(22) Filed: May 1, 2000

(30) Foreign Application Priority Data

May 6, 1999 (JP) ............................................ 11-125615

(51) Int. Cl.$^7$ ................................................ H03M 1/78
(52) U.S. Cl. ...................................... 341/154; 341/144
(58) Field of Search ................................ 341/154, 144, 341/153, 136; 340/347

(56) References Cited

U.S. PATENT DOCUMENTS

| | | | | |
|---|---|---|---|---|
| 4,591,826 A | * | 5/1986 | Seiler | 340/347 |
| 4,727,355 A | * | 2/1988 | Kohdaka et al. | 340/347 |
| 5,602,552 A | * | 2/1997 | Hirose et al. | 341/154 |

* cited by examiner

Primary Examiner—Peguy Jeanpierre
Assistant Examiner—Joseph Lauture
(74) Attorney, Agent, or Firm—Bret J. Petersen; Frederick J. Telecky, Jr.

(57) ABSTRACT

An R-2R type DA converter where the resistance value of the weighting resistors is set to a value calculated by adding the resistance value error to twice the standard resistance value. The resistance value of the terminating resistor (third-value resistor) is set to a value wherein the resistance value error is subtracted from twice the standard resistance value. With these resistance values, when a digital data signal is incremented even if the output voltage immediately before the digital signal is incremented is larger than the output voltage immediately after the digital signal is incremented, the output voltage immediately after the digital signal is incremented will not be excessively large compared to the output voltage immediately after the digital signal is incremented. So even if the resistance value varies so that the difference in voltage between the output voltage immediately before the digital signal is incremented and the output voltage immediately after the digital signal is incremented is large, the voltage difference between the output voltage immediately before the digital signal is incremented and the output voltage immediately after the digital signal is incremented will be smaller than in the past.

4 Claims, 2 Drawing Sheets

DIGITAL-ANALOG AND ANALOG-DIGITAL CONVERTER

FIELD OF THE INVENTION

The present invention pertains to the technical field of DA converters and AD converters, and more specifically, it pertains to high-precision DA converters and AD converters.

BACKGROUND OF THE INVENTION

Frequency synthesizers with discrete frequency divider PLL (phase lock loop) circuits are furnished with a compensation circuit, which compensates for ripple current present in the PLL control signals used for the internal control of the PLL circuits by adding a compensating current to the PLL control signals.

This compensation circuit has a capacitor and a DA converter. When digital data are input, the digital data undergo DA conversion by means of the DA converter, an analog voltage of a magnitude corresponding to the digital data is generated and impressed on the capacitor, and compensating current is added to the control signals by means of the charging and discharging of the capacitor. The precision of the compensating current depends on the precision of the DA converter, so it is preferable if the compensation circuit contains a high-precision DA converter.

A conventional R-2R type DA converter is indicated by symbol 110 in FIG. 4 as a DA converter. This DA converter 110 has standard voltage input terminal 120 and output terminal 130, as well as two terminating resistors $114_1$ and $114_2$, multiple unit resistors 111, weighting resistors 112, and switching circuits 113.

The multiple unit resistors 111, the multiple weighting resistors 112, and the terminating resistors $114_1$ and $114_2$ all have the same resistance values respectively.

Switching circuits 113 each have standard voltage terminal 115, ground potential terminal 116, switch terminal 117, and control terminal 118. They are designed so that when a signal is input to control terminal 118, switch terminal 117 can be connected to either standard voltage terminal 115 or ground potential terminal 116. Standard voltage terminal 115 is supplied with the standard voltage via standard voltage input terminal 120 and ground potential terminal 116 is supplied with ground potential, and switch terminal 117 can be connected to either the standard voltage or to ground.

The switching circuits 113 are laid out toward the ground potential connection from the output terminal 130, wherein the output terminal 130 is connected to the very first stage and the ground potential is connected to the very last stage. Here, there are 14 switching circuits 113. They are numbered in increasing order starting from output terminal 130 toward the ground potential connection, wherein switching circuits $113_1$–$113_{14}$ are arranged starting at output terminal 130 toward ground.

One weighting resistor $112_1$–$112_{14}$ is within each switching circuit $113_1$–$113_{14}$, and one end of weighting resistors $112_1$–$112_{14}$ is connected to switch terminal $117_1$–$117_{14}$ of switching circuits $113_1$–$113_{14}$.

The other end of weighting resistor $112_1$ within first-stage switching circuit $113_1$ is connected to output terminal 130, and the other end of weighting resistor $112_{14}$ within last-stage switching circuit $113_{14}$ is connected to ground via one terminating resistor $114_2$. The other terminating resistor $114_1$ is placed between output terminal 130 and ground.

The resistance value of weighting resistors 112 is set to twice the resistance value of unit resistors 111, and the resistance value of terminating resistors 114 is also set to twice the resistance value of unit resistors 111.

When the standard voltage is divided by aforementioned DA converter 110 to produce a magnitude that corresponds to the digital data; in other words, performing DA conversion, each bit of digital data is supplied to control terminals 114 as a signal that controls switching circuits 113 and a standard voltage Va is impressed on standard voltage input terminal 120.

Each switching circuit 113 connects switch terminal 117 either to standard voltage Va or to ground according to the signal input to control terminal 114. Here, when the signal input to control terminal 114 is "1," switch terminal 117 is connected to standard voltage Va, and when "0," switch terminal 117 is connected to ground.

In this case, 13 unit resistors 111 are furnished, and they are numbered in increasing order from output terminal 130 toward the ground potential connection, wherein the unit resistors 111 consist of unit resistors $111_1$–$111_{13}$. One end of unit resistor $111_1$ is connected to output terminal 130 and one end of unit resistor $111_{13}$ is connected to ground via terminating resistor $114_2$.

Weighting resistors $112_1$–$112_{13}$ and switching circuits $113_1$–$111_{13}$ are connected to one end of unit resistors $111_1$–$111_{13}$, respectively. Each switching circuit $113_1$–$113_{14}$ has a control terminal $118_1$–$118_{14}$. The bits of the digital data from most significant bit to least significant are input to the control terminals $118_1$–$118_{14}$, respectively.

In this case, N1–N14 are values of "1" or "0" that correspond to each bit of the 14-bit digital data, wherein N1 and N14 are values that correspond to the most significant bit and the least significant bit, respectively. From output terminal 130 of DA converter 110, an output voltage $V_O$ of a magnitude corresponding to the digital data is output such that:

$$Vo = (1/3) \times Va \times \{N(1) \times (1/2)^0 + N(2) \times (1/2)^1 + N(3) \times (1/2)^2 + N(4) \times (1/2)^3 + \ldots + N(13) \times (1/2)^{12} +$$

If the resistance values of weighting resistors $112_1$–$112_{13}$ and the resistance values of terminating resistors $114_1$ and $114_2$ are equal to twice the resistance value of unit resistors $111_1$–$111_{13}$, a standard voltage Va can be divided equally into minimum steps $1/3 \times Va \times 1/2^{13}$ in order to output the output voltage $V_O$, wherein an output voltage $V_O$ with a magnitude corresponding to the digital data can be output for equal intervals of the range 0–Va.

However, with the DA converter 110 mentioned above, when the resistance values of unit resistors $111_1$–$111_{13}$ and weighting resistors $112_1$–$112_{14}$ are different relative to each other, the standard voltage Va will not be divided into equal intervals over the range 0–Va. Particularly when the digital input signal is incremented by one, the output voltage immediately after the incremented digital signal is input will be excessively large, and there is the problem that the voltage difference with the output voltage immediate before the digital signal is incremented is a large, so there is a large error, and the precision of DA conversion will decrease.

The present invention was devised to solve the aforementioned problems of the prior art. Its purpose is to offer a high-precision DA converter and an AD converter that use the present invention.

SUMMARY OF THE INVENTION

In order to solve the aforementioned problems, the invention described herein offers a DA converter that has n switching circuits equipped with: a first input terminal, a second input terminal, a control terminal, and a switch terminal, which can be connected to the aforementioned first input terminal or the aforementioned second input terminal according to the signal input to the aforementioned control terminal; (n−1) first-value resistors connected in series; n second-value resistors, which are each connected at one end to the aforementioned switch terminals of the aforementioned n switching circuits; first and second third-value resistors connected between one end of the first first-value resistors and a standard voltage and between end of the (n−1)th first-value resistors and the aforementioned standard voltage, respectively; standard voltage input terminals connected to each first input terminal of the aforementioned n switching circuits; and an output terminal connected to the mid-point of the connection between one end of the first of the aforementioned first-value resistors and the aforementioned first third-value resistor and to the other end of the first of the aforementioned second-value resistors. The other end of the second to (n−1)th of the aforementioned second-value resistors is connected to the mid-point of the connection between the other end of the k±h (k=1 to (n−2)) first-value resistors and the aforementioned end of the (k+1)th first-value resistors, and the other end of the nth second-value resistors is connected to the mid-point of the connection of the other end of the (k+1)th first-value resistors and the aforementioned second third-value resistor. Each second input terminal of the aforementioned n switching circuits is connected to the aforementioned standard voltage. The resistance value of the aforementioned first-value resistors, the aforementioned second-value resistors, and the aforementioned third-value resistors is R−ΔR, 2R+ΔR, and 2R−ΔR, respectively (ΔR is the resistance value error for a resistance value R).

Also, another embodiment of the invention offers a sequential comparison type AD converter that has a DA comparator as described above.

With the DA converter of the present invention, the resistance value of the weighting resistors (second-value resistors) is set to twice the resistance value of the unit resistors (first-value resistors). As an example, the resistance value of the unit resistor is set to a value wherein a small resistance value error (ΔR) relative to a standard resistance value is subtracted from the unit resistance value (R). The resistance value of the weighting resistor is set to a value calculated by adding the resistance value error to twice the standard resistance value. The resistance value of the terminating resistor (third-value resistor) is set to a value wherein the resistance value error is subtracted from twice the standard resistance value.

By setting the resistance value of each resistance in this way, when a digital data signal is incremented even if the output voltage immediately before the digital signal is incremented is larger than the output voltage immediately after the digital signal is incremented, the output voltage immediately after the digital signal is incremented will not be excessively large compared to the output voltage immediately after the digital signal is incremented. So even if the resistance value varies so that the difference in voltage between the output voltage immediately before the digital signal is incremented and the output voltage immediately after the digital signal is incremented is large, the voltage difference between the output voltage immediately before the digital signal is incremented and the output voltage immediately after the digital signal is incremented will be smaller than in the past.

Thus, error with DA conversion caused by the voltage difference of the output voltage immediately before the digital signal is incremented and immediately after the digital signal is incremented will be small, and a DA conversion with higher precision than in the past can be realized.

Also, the appropriate resistance value error can be set according to the predicted variation in resistance values between the resistance value of the weighting resistor and the resistance value of the unit resistor, so that, when a large variation in resistance values is predicted, the resistance value error is set to a larger value, and when a small variation is predicted, the resistance value error is set to a smaller value.

REFERENCE NUMERALS AND SYMBOLS AS SHOWN IN THE DRAWINGS

In the figures, 1 represents an AD converter, 2 represents a comparator, 3 represents a logic circuit, 6 represents an input terminal, 7 represents an output terminal, 10 represents a DA converter, $11_1$–$11_{14}$ represent unit resistors, $12_1$–$12_{14}$ represent weighting resistors, $13_1$–$13_{14}$ represent switching circuits, $14_1$–$14_2$ represent terminating resistors, $15_1$–$15_{14}$ represent standard voltage terminals, $16_1$–$16_{14}$ represent ground potential terminals, $17_1$–$17_{14}$ represent switch terminals, $18_1$–$18_{14}$ represent a control terminals, 20 represents a standard voltage input terminal, and 30 represents an output terminal.

DESCRIPTION OF THE EMBODIMENTS

An embodiment of the present invention is explained below with reference to the figures.

Figure 1:
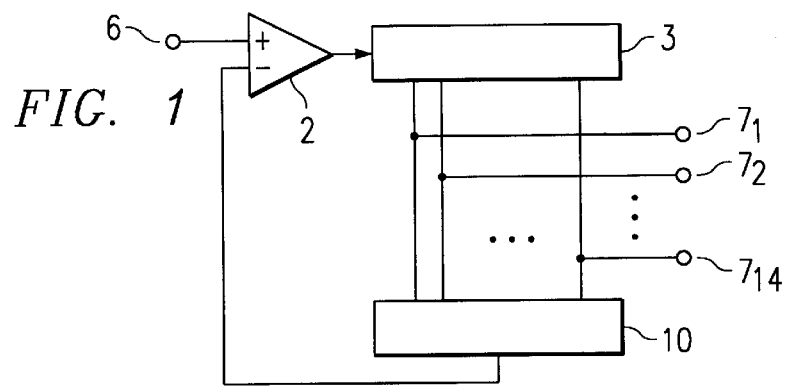
FIG. 1 is a block diagram showing an AD converter of the present invention.

The symbol 1 in FIG. 1 represents the sequential comparison type AD converter of the present invention. This AD converter 1 has comparator 2, logic circuit 3, and DA converter 10, and it is arranged within a compensation circuit. This compensation circuit is furnished in a frequency synthesizer that has a discrete frequency divider PLL circuit and it is a circuit that is necessary to compensate for ripple current included in the control signals that control the PLL circuit.

Comparator 2 has two input terminals: a non-inverting input (+) and an inverting input (−). Input terminal 6 of AD converter 1 is connected to the non-inverting input (+), and an analog input voltage will be input via input terminal 6.

The input of logic circuit 3 is connected to the output of comparator 2, and the inputs of DA converter 10 and the output terminals $7_1$–$7_{14}$ are connected to the outputs of logic circuit 3. Thus, the output of comparator 2 can be input to DA converter 10 after being arithmetically processed by logic circuit 3.

The output of DA converter 10 is connected to the inverting input (−) of comparator 2 and the output of logic circuit 3 is DA converted so that it can be output to the inverting input (−) of comparator 2.

Comparator 2 compares the output voltage Vo and input voltage Vi of DA converter 10 and outputs the result of that comparison to logic circuit 3.

In aforementioned AD converter 1, first, input voltage Vi is input to the non-inverting input (+) of comparator 2 via input terminal 6.

At the same time, a 14-bit data signal wherein the most significant bit is "1" and all the other bits are "0" is output to DA converter 10 from logic circuit 3.

Figure 2:
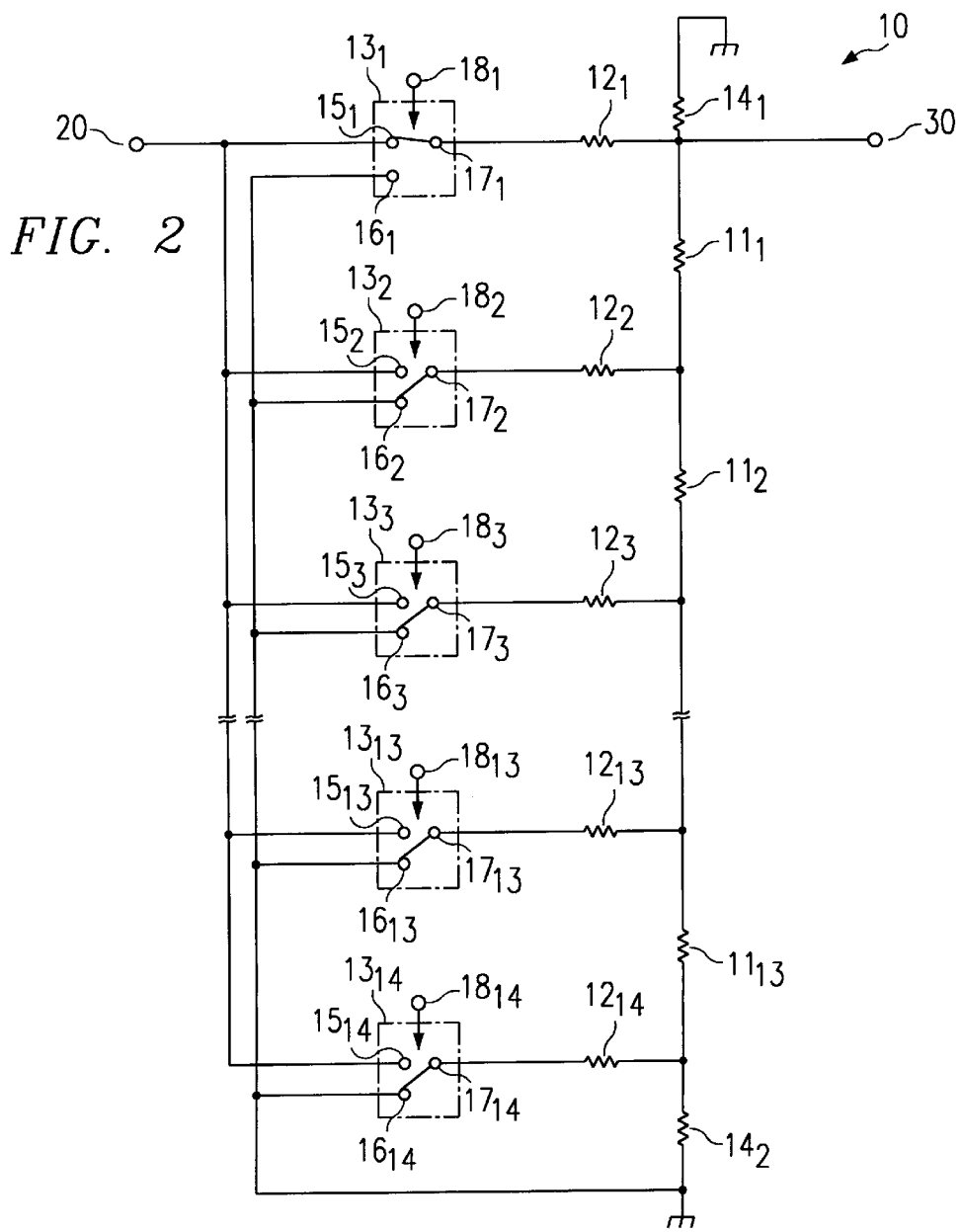
FIG. 2 is a diagram showing a DA converter of the present invention.

The detailed constitution of DA converter 10 of the present invention is shown in FIG. 2. This DA converter 10 has standard voltage input terminal 20 and output terminal 30, as well as two terminating resistors $14_1$ and $14_2$, multiple unit resistors 11, weighting resistors 12, and switching circuits 13.

Switching circuits 13 each have a standard voltage terminal 15, a ground potential terminal 16, switch terminal 17, and a control terminal 18. When a signal is input to control terminal 18, switch terminal 17 can be connected to either standard voltage terminal 15 or ground potential terminal 16. Standard voltage terminal 15 is connected to standard voltage input terminal 20 and ground potential terminal 16 is connected to ground. Standard voltage input terminal 20 can supply a potential equal to the standard voltage.

One weighting resistor 12 is furnished for each switching circuit 13, and a switch terminal 17 is connected to one end of each weighting resistor 12.

Switching circuits 13, which are furnished with weighting resistors 12, are arranged one by one from output terminal 30 toward ground wherein the output terminal 30 is connected to the very first stage and the ground potential connection is connected to the very last stage. With this embodiment, fourteen switching circuits 13 are furnished, and these fourteen switching circuits 13 are numbered as switching circuits $13_1$–$13_{14}$ in increasing order from the output terminal 30 to ground. One weighting resistor $12_1$–$12_{14}$ is furnished for each switching circuit $13_1$–$13_{14}$.

The other end of weighting resistor $12_1$ within first stage switching circuit $13_1$ is connected to output terminal 30, and the other end of weighting resistor $12_{14}$ furnished for last stage switching circuit $13_{14}$ is connected to ground via one terminating resistor $14_2$.

Unit resistors 11 are placed between two weighting resistors 12, which are associated with two adjacent switching circuits 13, and they are connected in series between output terminal 30 and one terminating resistor $14_2$. With this embodiment, there are thirteen unit resistors 11 and they are numbered as unit resistors $11_1$–$11_{13}$ in increasing order from the output terminal 30 toward ground. Also, of the two terminating resistors 14, the other terminating resistor $14_1$ is placed between output terminal 30 and ground.

With aforementioned DA converter 10, in order to perform DA conversion by dividing the standard voltage and generating a magnitude corresponding to the digital data, each bit of the digital data is supplied 1 bit at a time to control terminal 18 of switching circuit 13 as a control signal and the standard voltage Va is impressed on standard voltage input terminal 20.

Each switching circuit 13 connects switch terminal 17 either to standard voltage Va or to ground, according to the signal input to control terminal 18. Here, assume that when the signal input to control terminal 18 is "1," switch terminal 17 is connected to standard voltage Va, and when the input signal is "0", switch terminal 17 is connected to ground.

With this embodiment, assume that each switching circuit $13_1$–$13_{14}$ has its own control terminal $18_1$–$18_{14}$ and that a digital data signal is input to each control terminal $18_1$–$18_{14}$ one bit at a time from the most significant bit to the least significant bit.

In this case, $N(1)$–$N(14)$ are values of "1" or "0" that correspond to each bit of the 14-bit digital data, wherein $N(1)$ and $N(14)$ are values that correspond to the most significant bit and least significant bit, respectively. Further, the resistance values of weighting resistors 12, unit resistors 11, and terminating resistors 14 are $R_1$, $R_2$, and $R_3$, respectively. From output terminal 30 of DA converter 10, an output voltage Vo of a magnitude corresponding to the digital data is output such that:

$$Vo = \{R_3/(R_1 + R_3)\} \times$$
$$Va \times [N(1) \times \{R_1/(R_1 + R_3)\}^0 + N(2) \times \{R_1/(R_1 + R_3)\}^1 +$$
$$N(3) \times \{R_1/(R_1 + R_3)\}^2 + N(4) \times \{R_1/(R_1 + R_3)\}^3 + \ldots +$$
$$N(13) \times \{R_1/(R_1 + R_3)\}^{12} + N(14) \times \{R_1/(R_1 + R_3)\}^{13}]$$

Here, if the standard resistance is R and the resistant value error is ΔR, the resistance values $R_1$, $R_2$, and $R_3$ of weighting resistors 12, unit resistors 11, and terminating resistors 14 will be (2R+ΔR), (R−ΔR), and (2R−ΔR), respectively.

Here, the resistance value error ΔR is a value set according to the predicted variation in the resistance values of weighting resistors 12. Here, assuming that the resistance values of the weighting resistors 12 are predicted to vary by 1%, ΔR is set to 0.02R corresponding to the voltage, and the resistance values $R_1$, $R_2$, and $R_3$ become 2.02R, 0.98R and 1.98R, respectively.

$$Vo = (1.98/4) \times$$
$$Va \times [N(1) \times (2.02/4)^0 + N(2) \times (2.02/4)^1 + N(3) \times (2.02/4)^2 +$$
$$N(4) \times (2.02/4)^3 + \ldots + N(13) \times (2.02/4)^{12} + N(14) \times (2.02/4)^{13}]$$

With these assignments from output terminal 30 of DA converter 10, an output voltage Vo is output such that:

In this way, DA converter 10 can divide the standard voltage Va into minimum steps equal to $(1.98/4) \times Va \times (2.02/4)^{13}$, and output voltage Vo can be output at a magnitude that corresponds to the digital data.

As an example, when the digital data signal "00000000111111" is input into aforementioned DA converter 10, from DA converter 10, an output voltage Vo is output such that:

$$Vo = (1.98/4) \times Va \times \{0 \times (2.02/4)^0 + 0 \times (2.02/4)^1 + 0 \times (2.02/4)^2 + \ldots +$$
$$0 \times (2.02/4)^7 + 1 \times (2.02/4)^8 + 1 \times (2.02/4)^9 + 1 \times (2.02/4)^{10} +$$
$$1 \times (2.02/4)^{11} + 1 \times (2.02/4)^{12} + 1 \times (2.02/4)^{13}\}$$
$$= 0.495 \times Va \times (0.0042299 + 0.0021361 + 0.0010787 + 0.0005448 +$$
$$0.0002751 + 0.0001389)$$
$$= 0.004159 \times Va$$

In the same way, when the digital data signal "00000001000000," which is 1 greater than aforementioned "00000000111111," is input, output an voltage Vo is output such that:

$$Vo = (1.98/4) \times Va \times \{0 \times (2.02/4)^0 + 0 \times (2.02/4)^1 + \ldots + 0 \times (2.02/4)^6 +$$
$$1 \times (2.02/4)^7 + 0 \times (2.02/4)^8 + \ldots + 0 \times (2.02/4)^{13}\}$$
$$= (1.98/4) \times Va \times \{1 \times (2.02/4)^7\}$$
$$= 0.495 \times Va \times (0.0083761)$$
$$= 0.004146 \times Va$$

Also, when the digital data signal "00000001000001," which is 1 greater than aforementioned "00000001000000," is input, output voltage Vo is output such that:

$$0 \times (2.02/4)^8 + \ldots + 0 \times (2.02/4)^{12} + 1 \times (2.02/4)^{13}\}$$

$$Vo = (1.98/4) \times Va \times \{1 \times (2.02/4)^7 + 1 \times (2.02/4$$
$$= 0.495 \times Va \times (0.0083761 + 0.000138$$
$$= 0.004214 \times Va$$
$$Vo = (1.98/4) \times Va \times \{0 \times (2.02/4)^0 + 0 \times (2.02/4)^1 + \ldots + 0 \times (2.02/4)^6 +$$
$$1 \times (2.02/4)^7 + 0 \times (2.02/4)^8 + \ldots + 0 \times (2.02/4)^{12} + 1 \times (2.02/4)^{13}\}$$
$$Vo = (1.98/4) \times Va \times \{1 \times (2.02/4)^7 + 1 \times (2.02/4$$
$$= 0.495 \times Va \times (0.0083761 + 0.000138$$
$$= 0.004214 \times Va$$

With a general R-2R type DA converter, each time the data increase, the output voltage Vo also increases and the output voltage Vo never decreases when the data increase. But with the DA converter 10 of this embodiment, when the digital data are carried from "00000000111111" to "00000001000000," output voltage Vo decreases from 0.004159×Va to 0.004146×Va, and then it increases again to 0.004214×Va.

Figure 3A:
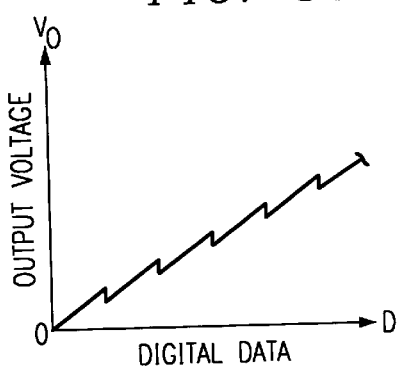
FIG. 3 includes (a): Diagram that explains the relationship between the digital data signal and the output voltage produced by the DA converter of this embodiment and (b): Diagram that explains the relationship between the digital data signal and the output voltage produced by a conventional R-2R type DA converter.

In this way, with the DA converter 10 of this embodiment, when the digital signal is incremented from "00000000111111" to "00000001000000," output voltage Vo decreases, and output voltage Vo also decreases whenever a digital signal is incremented and not just in this instance. As shown in FIG. 3(a), when the input digital data signal is incremented, after output voltage Vo increases, it decreases while the digital signal is incremented and then increases after this decreasing stage, and this process is repeated.

Figure 3B:
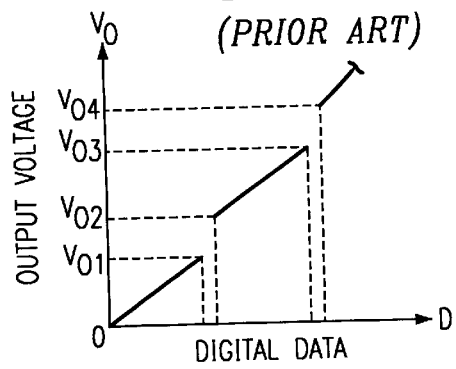
Figure 4:
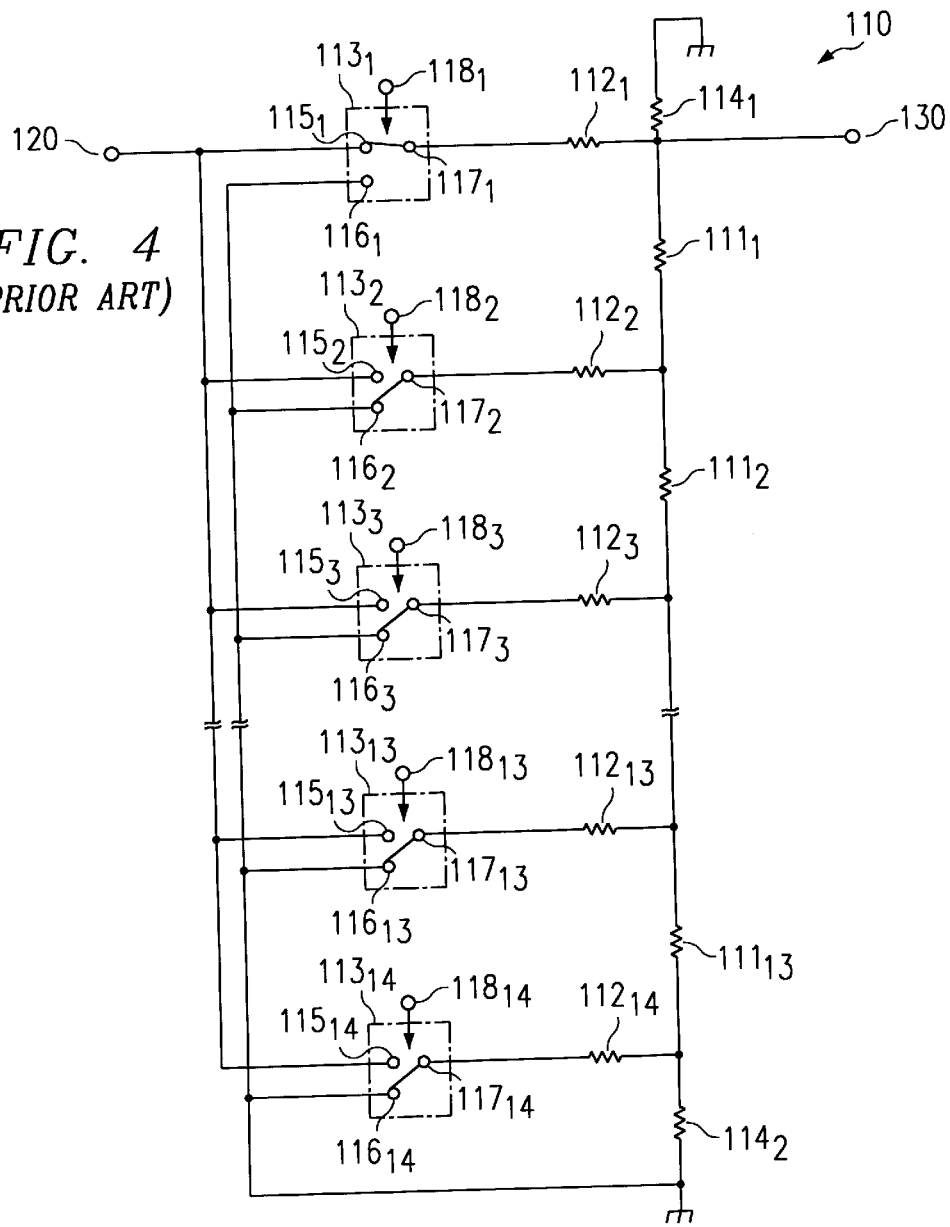
FIG. 4 is a diagram showing a conventional DA converter.

On the other hand, with a conventional R-2R ladder-type DA converter, where the resistance value of the weighting resistors is 2R or twice the resistance value R of the unit resistors, when the 14-bit digital data signal is DA converted, by dividing standard voltage Va into equal intervals of a minimum step $(1/3) \times Va \times (1/2)^{13}$, the output voltage Vo can be output in equivalent steps. But when the resistance value of the weighting resistors varies relative to the resistance value of the unit resistors, when the digital signal is incremented as shown in FIG. 3(b), the voltage difference between output voltages $V_{O1}$ and $V_{O3}$ immediately before the digital signal is incremented and output voltages $V_{O2}$ and $V_{O4}$ immediately after the digital signal is incremented will be large. This voltage difference results in an error during DA conversion and the precision of the DA conversion is reduced.

However, with DA converter 10 of the present invention, as stated above, the resistance values of weighting resistors $12_1$–$12_{14}$, unit resistors $11_1$–$11_{13}$, and terminating resistors $14_1$ and $14_2$ are set to 2.02R, 0.98R, and 1.98R, respectively, so when the digital data signal is incremented even if output voltage immediately before the digital signal is incremented becomes larger than the output voltage immediately after the digital signal is incremented, the output voltage immediately after the digital signal is incremented will not be excessively large, compared to the output voltage immediately before the digital signal is incremented. So even if the voltage values of unit resistors $11_1$–$11_{13}$, weighting resistors $12_1$–$12_{13}$, and terminating resistors $14_1$ and $14_2$ vary so that the voltage difference between the output voltage immediately before the digital signal is incremented and the output voltage immediately after the digital signal is incremented becomes large, the voltage difference between the output voltage immediately before the digital signal is incremented and the output voltage immediately after the digital signal is incremented can be made smaller than in the past.

Thus, errors during the DA conversion due to voltage differences of these output voltages can be made smaller, and a DA conversion with higher precision than that in the past can be realized.

The DA converter 10 of the present invention, as described above, DA converts the 14-bit data signal that is input from logic circuit 3 in FIG. 1 in order to generate output voltage Vo, which is output to comparator 2.

First, assuming that the digital data signal "10000000000000," where the most significant bit is "1" and the other 13 bits are "0," is output from logic circuit 3, from output terminal 30, an output voltage $V_o$ is output such that:

$$Vo = (1.98/4) \times Va \times \{1 \times (2.02/4)^0 + 0 \times (2.02/4)^1 + 0 \times (2.02/4)^2 + \ldots +$$
$$0 \times (2.02/4)^{13}\}$$
$$= 0.495 \times Va$$

Comparator 2 compares input voltage Vi and output voltage Vo. If input voltage Vi is greater than output voltage Vo, "1" is used as the most significant bit, and if input voltage Vi is smaller than output voltage Vo, "0" is used as the most significant bit. Based on the result of this comparison, logic circuit 3 confirms the most significant bit of the output digital data.

Next, logic circuit 3 generates a 14-bit data signal where the most significant bit (14th bit) is verified, a "1" is used for the bit that is one less than the most significant bit (13th bit) and a "0" is used for all the remaining lesser significant bits.

With the results of comparison, if logic circuit 3 verifies that the most significant bit is "1," it generates a new 14-bit data signal "11000000000000," where the most significant bit and the 13th bit are "1" and the other bits are "0." When it verifies that the most significant bit is "0," it generates a new data signal "01000000000000," where only the 13th bit is "1" and the other bits are "0." Logic circuit (3) corrects the 14-bit digital data signal in this way and outputs it to DA converter 10.

DA converter 10 DA converts the corrected 14-bit data signal and generates a new output voltage Vo.

In this case, when the data signal "11000000000000" is output from logic circuit 3, the new output voltage Vo will be:

$$Vo = (1.98/4) \times Va \times \{1 \times (2.02/4)^0 + 1 \times (2.02/4)^1 + 0 \times (2.02/4)^2 + \ldots +$$
$$0 \times (2.02/4)^{13}\}$$

$$= 0.745 \times Va$$

On the other hand, when the data signal "01000000000000" is output from logic circuit 3, the new output voltage Vo will be:

$$Vo = (1.98/4) \times Va \times \{0 \times (2.02/4)^0 + 1 \times (2.02/4)^1 + 0 \times (2.02/4)^2 + \ldots + 0 \times (2.02/4)^{13}\}$$

$$= 0.245 \times Va$$

DA converter 10 outputs a new output voltage Vo generated in this way to comparator 2.

Comparator 2 compares new output voltage Vo and input voltage Vi. If input voltage Vi is greater than output voltage Vo, "1" is used for the compared bit, and if input voltage Vi is smaller than output voltage Vo, "0" is used for the compared bit. Based on the result of this comparison, logic circuit 3 confirms that the 13th bit of the digital data is "1" or "0" and generates a new digital data signal again.

After this, logic circuit 3 generates a 14-bit digital data signal where the 14th bit and 13th bit are verified, "1" is used for the 12th bit, and "0" is used for all the remaining lesser significant bits, and this signal is output to DA converter 10.

In this way, the AD converter 1 of the present invention repeats its operation to confirm each bit of the digital data signal one bit at a time starting with the most significant bit, based on the results of comparison by comparator 2. Through confirmation from the most significant bit to the least significant bit, a digital data signal of a magnitude that corresponds to input voltage Vi is generated and output to external equipment, not shown, from output terminals $7_1$–$7_{14}$.

AD converter 1 of the embodiment explained above uses DA converter 10, which has high conversion precision, explained with FIG. 2, so the precision of AD conversion is improved compared to a conventional R-2R ladder-type DA converter.

Note that, with this embodiment, the resistance value error was assumed to be 1% of the resistance of weighting resistors $12_1$–$12_{14}$, which corresponds to a case where the resistance values of weighting resistors $12_1$–$12_{14}$ varies by 1%, and the resistance values of weighting resistors $12_1$–$12_{14}$, unit resistors $11_1$–$11_{13}$, and terminating resistors $14_1$ and $14_2$ were set to 2.02R, 0.98R, and 1.98R, respectively. But the present invention is not limited to this example.

For example, if it is understood that the resistance value of weighting resistors $12_1$–$12_{14}$ varies by a maximum of around 0.5%, the resistance value error ΔR could be set such that ΔR=0.01R, anticipating the error in the resistance values of weighting resistors $12_1$–$12_{14}$, and the resistance values of weighting resistors $12_1$–$12_{14}$, unit resistors $11_1$–$11_{13}$, and terminating resistors $14_1$ and $14_2$ could be set to 2.01R, 0.99R, and 1.99R, respectively.

Also, with this embodiment, a 14-bit DA converter 10 was explained, but the number of bits of the DA converter 10 of the present invention is not limited to this and it could also be applied to a 16-bit or 20-bit DA converter or the like.

It is possible to produce a DA converter and an AD converter with high precision.

What is claimed is:

1. A Digital to Analog (DA) converter comprising:

n switching circuits equipped with a first input terminal, a second input terminal, a control terminal, and a switch terminal, which can be connected to the aforementioned first input terminal or the aforementioned second input terminal according to the signals input from the aforementioned control terminal, (n−1) first-value resistors connected in series, n second-value resistors, which are each connected at one end to the aforementioned switch terminal of the aforementioned n switching circuits, first and second third-value resistors connected between one end of the first first-value resistors and a standard voltage and between one end of the (n−1)th first-value resistors and the aforementioned standard voltage, respectively, standard voltage input terminals connected to each first input terminal of the aforementioned n switching circuits, and an output terminal connected to the mid-point of the connection between one end of the first of the aforementioned first-value resistors and the aforementioned first third-value resistor, and to the other end of the first of the aforementioned second-value resistors, wherein the other end of the second to (n−1)th of the aforementioned second-value resistors is connected to the mid-point of the connection between the other end of the kth (k=1 to (n−2) first-value resistors and the aforementioned end of the (k+1)th first-value resistors, the other end of the nth second-value resistor is connected to the mid-point of the connection of the other end of the (k+1)th first-value resistors and the aforementioned second third-value resistor, each of the second input terminals of the aforementioned n switching circuits is connected to the aforementioned standard voltage, and the resistance values of the aforementioned first-value resistors, the aforementioned second-value resistors, and the aforementioned third-value resistors are set to R−ΔR, 2R+ΔR, and 2R−ΔR, respectively (ΔR is the resistance value error for a resistance value R).

2. The DA converter of claim 1 incorporated into a sequential comparison type AD converter.

3. An R-2R type Digital to Analog (DA) converter comprising:

a plurality of serially connected unit resistors;

a plurality of weighting resistors with one termination connected to a unit resistors; and two terminating resistors, one each connected to the series of unit resistors, where the resistance values of the unit resistors, the weighting resistors, and the terminating resistors are set to R−ΔR, 2R+ΔR, and 2R−ΔR, respectively, where ΔR is the resistance value error for a resistance value R.

4. The DA converter of claim 3 incorporated into a sequential comparison type AD converter.

* * * * *